United States Patent
Hong

(10) Patent No.: US 11,164,644 B2
(45) Date of Patent: Nov. 2, 2021

(54) STORAGE DEVICE AND METHOD OF OPERATING THE SAME

(71) Applicant: SK hynix Inc., Gyeonggi-do (KR)

(72) Inventor: Jiman Hong, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 4 days.

(21) Appl. No.: 16/827,358

(22) Filed: Mar. 23, 2020

(65) Prior Publication Data

US 2021/0065826 A1   Mar. 4, 2021

(30) Foreign Application Priority Data

Sep. 3, 2019   (KR) .................. 10-2019-0108641

(51) Int. Cl.
| | |
|---|---|
| G11C 16/34 | (2006.01) |
| G11C 16/04 | (2006.01) |
| G11C 16/10 | (2006.01) |
| G06F 3/06 | (2006.01) |
| G11C 16/14 | (2006.01) |

(52) U.S. Cl.
CPC ........ *G11C 16/3459* (2013.01); *G06F 3/0604* (2013.01); *G06F 3/0659* (2013.01); *G06F 3/0679* (2013.01); *G11C 16/0483* (2013.01); *G11C 16/10* (2013.01); *G11C 16/14* (2013.01)

(58) Field of Classification Search
CPC ................................................. G11C 16/3459
See application file for complete search history.

(56) References Cited

U.S. PATENT DOCUMENTS

| | | | |
|---|---|---|---|
| 2016/0148695 A1* | 5/2016 | Kim | G11C 29/42 |
| | | | 365/185.03 |
| 2020/0234768 A1* | 7/2020 | Lin | G11C 16/10 |

FOREIGN PATENT DOCUMENTS

| | | |
|---|---|---|
| KR | 10-1653206 | 9/2016 |
| KR | 10-2017-0011641 | 2/2017 |

* cited by examiner

*Primary Examiner* — Douglas King
(74) *Attorney, Agent, or Firm* — IP & T Group LLP

(57) ABSTRACT

A memory device may include a memory cell array, a program and verify circuit, a verify table storage, and a program fail detector. The memory cell array may include memory cells. The program and verify circuit may perform a program operation of programming the memory cells to a corresponding target state of a plurality of states, and generate verification data including cell count values that respectively correspond to one or more states among the plurality of states. The verify table storage may store, for each program pulse count, reference data including reference cell count values that respectively correspond to the plurality of states. The program fail detector may detect whether the program operation has failed based on a result of a comparison between the verification data and the reference data corresponding to a current program pulse count, and generate program fail information indicating that the program operation has failed.

21 Claims, 12 Drawing Sheets

FIG. 7

VERIFY TABLE

| PGM Pulse \ State | E | P1 | P2 | P3 | P4 | P5 | P6 | P7 |
|---|---|---|---|---|---|---|---|---|
| 1 | 2000 | 5000 | 800 | 180 | 20 | 0 | 0 | 0 |
| 2 | 1000 | 1500 | 4500 | 800 | 180 | 20 | 0 | 0 |
| 3 | 1000 | 1000 | 1500 | 3500 | 800 | 150 | 20 | 0 |
| ... | ... | ... | ... | ... | ... | ... | ... | ... |
| n-1 | 1000 | 1000 | 1000 | 1000 | 1000 | 1000 | 1300 | 700 |
| n | 1000 | 1000 | 1000 | 1000 | 1000 | 1000 | 1000 | 1000 |

REFERENCE DATA

VERIFICATION DATA

| 2 | 1000 | 1500 | 4400 | 850 | 190 | 20 | 40 | 0 |
|---|---|---|---|---|---|---|---|---| ced
STORAGE DEVICE AND METHOD OF OPERATING THE SAME

CROSS-REFERENCE TO RELATED APPLICATION

The present application claims priority under 35 U.S.C. § 119(a) to Korean patent application number 10-2019-0108641 filed on Sep. 3, 2019, the entire disclosure of which is incorporated herein by reference in its entirety.

BACKGROUND

1. Technical Field

Various embodiments of the present disclosure generally relate to an electronic device, and more particularly, to a storage device and a method of operating the storage device.

2. Related Art

Generally, a storage device is a device which stores data under control of a host device such as a computer or a smartphone. The storage device may include a memory device configured to store data, and a memory controller configured to control the memory device. Memory devices are chiefly classified into volatile memory devices and nonvolatile memory devices.

A volatile memory device is a memory device, which stores data only when power is supplied thereto, and in which data stored therein is lost when power is turned off. Examples of a volatile memory device include a static random access memory (SRAM), and a dynamic random access memory (DRAM).

A nonvolatile memory device is a memory device in which data stored therein is maintained even when power is turned off. Examples of a nonvolatile memory device include a read-only memory (ROM), a programmable ROM (PROM), an electrically programmable ROM (EPROM), an electrically erasable programmable ROM (EEPROM), and a flash memory.

SUMMARY

Various embodiments of the present disclosure are directed to a storage device having improved program fail detecting performance, and a method of operating the storage device.

An embodiment of the present disclosure may provide for a memory device including a memory cell array, a program and verify circuit, a verify table storage, and a program fail detector. The memory cell array may include a plurality of memory cells. The program and verify circuit may perform a program operation of programming each of the plurality of memory cells to a corresponding target state of a plurality of states, and generate verification data including cell count values that respectively correspond to one or more states among the plurality of states. The verify table storage may store, for each program pulse count, reference data including reference cell count values that respectively correspond to the plurality of states. The program fail detector may detect whether the program operation has failed based on a result of comparison between the verification data and the reference data corresponding to a current program pulse count, and generate program fail information indicating whether the program operation has failed.

An embodiment of the present disclosure may provide for a method of operating a memory device including a plurality of memory cells. The method may include: performing a program operation of programming each of the plurality of memory cells to a corresponding target state of a plurality of states; generating verification data including cell count values that respectively correspond to one or more states among the plurality of states; and detecting whether the program operation has failed based on a result of comparison between the verification data and reference data. The reference data may include reference cell count values that respectively correspond to the plurality of states and are determined based on a program pulse count that is a number of times a program pulse has applied to the plurality of memory cells.

An embodiment of the present disclosure may provide for a storage device including a memory device and a memory controller. The memory device may include a plurality of memory blocks. The memory controller may control the memory device to perform a program operation of programming each of a plurality of memory cells included in a selected block among the plurality of memory blocks to a corresponding target state of a plurality of states. The memory device may detect that the program operation has failed, based on a result of comparison between reference cell count values and cell count values that respectively correspond to one or more states among the plurality of states, and generate program fail information indicating whether the program operation has failed. The reference cell count values may be determined based on a program pulse count that is a number of times a program pulse has been applied to the plurality of memory cells.

An embodiment of the present disclosure may provide for a method of operating a memory device including a plurality of memory cells. The method may include: performing a program operation of programming the memory cells to corresponding target states among predetermined states; counting a number of the memory cells that have each of the predetermined states due to the program operation; and determining the program operation to fail when the number is out of a predetermined range, wherein the predetermined range depends on a number of program pulses applied to the memory cells during the program operation.

BRIEF DESCRIPTION OF THE DRAWINGS

FIG. 7 is a diagram for describing reference data and verification data in accordance with an embodiment.

DETAILED DESCRIPTION

Hereinafter, embodiments of the present disclosure will be described in detail with reference to the attached drawings.

Figure 1:
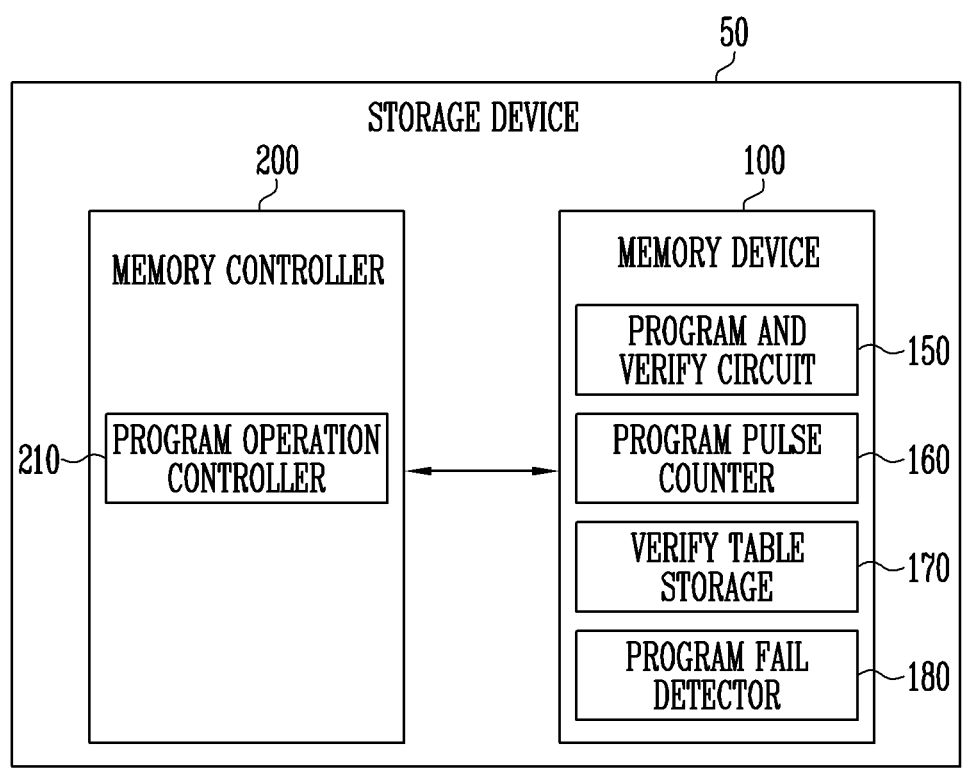
FIG. 1 is a diagram illustrating a storage device in accordance with an embodiment of the present disclosure.

FIG. 1 is a diagram illustrating a storage device 50 in accordance with an embodiment of the present disclosure.

Referring to FIG. 1, the storage device 50 may include a memory device 100 and a memory controller 200 configured to control the operation of the memory device 100. The storage device 50 may be a device configured to store data under control of a host such as a cellular phone, a smartphone, an MP3 player, a laptop computer, a desktop computer, a game machine, a TV, a tablet PC, or an in-vehicle infotainment system.

The storage device 50 may be manufactured as any one of various types of storage devices depending on a host interface, which is a communication system for communicating with the host. For example, the data storage device 50 may be configured as any one of various types of storage devices such as an SSD, MMC, eMMC, RS-MMC, or micro-MMC type multimedia card, an SD, mini-SD, micro-SD type secure digital card, a universal serial bus (USB) storage device, a universal flash storage (UFS) device, a personal computer memory card international association (PCMCIA) card type storage device, a peripheral component interconnection (PCI) card type storage device, a PCI-express (PCI-E) type storage device, a compact flash (CF) card, a smart media card, and a memory stick.

The storage device 50 may be manufactured in the form of any one of various package types. For instance, the storage device 50 may be manufactured in the form of any one of various package types such as a package on package (POP) type, a system in package (SIP) type, a system on chip (SOC) type, a multi-chip package (MCP) type, a chip on board (COB) type, a wafer-level fabricated package (WFP) type, and a wafer-level stack package (WSP) type.

The memory device 100 may store data therein. The memory device 100 may operate under control of the memory controller 200. The memory device 100 may include a memory cell array including a plurality of memory cells configured to store data therein.

The memory cells may include a single-level cell (SLC) capable of storing a single data bit, a multi-level cell (MLC) capable of storing two data bits, a triple-level cell (TLC) capable of storing three data bits, or a quad-level cell (QLC) capable of storing four data bits.

The memory cell array may include a plurality of memory blocks. Each memory block may include a plurality of memory cells. Each memory block may include a plurality of pages. In an embodiment, each page may be the unit of storing data in the memory device 100 or reading stored data from the memory device 100.

Each memory block may be the unit of erasing data. In an embodiment, the memory device 100 may be a double data rate synchronous dynamic random access memory (DDR SDRAM), a low power double data rate4 (LPDDR4) SDRAM, a graphics double data rate (GDDR) SDRAM, a low power DDR (LPDDR), a rambus dynamic random access memory (RDRAM), a NAND flash memory, a vertical NAND flash memory, a NOR flash memory device, a resistive random access memory (RRAM), a phase-change memory (PRAM), a magnetoresistive random access memory (MRAM), a ferroelectric random access memory (FRAM), or a spin transfer torque random access memory (STT-RAM). In this specification, the memory device 100 is a NAND flash memory, however, other memory devices may be used.

The memory device 100 may receive a command and an address from the memory controller 200, and access an area of the memory cell array that is selected by the address. In other words, the memory device 100 may perform an operation instructed by the command on the area selected by the address. For example, the memory device 100 may perform a write (program) operation, a read operation, and an erase operation. During a program operation, the memory device 100 may program data to an area selected by an address. During a read operation, the memory device 100 may read data from an area selected by an address. During an erase operation, the memory device 100 may erase data from an area selected by an address.

In an embodiment, the memory device 100 may include a program and verify circuit 150, a program pulse counter 160, a verify table storage 170, and a program fail detector 180.

The program and verify circuit 150 may perform a program operation for memory cells. The program operation may include a program pulse application operation and a program verify operation.

In an embodiment, the program pulse application operation may be an operation of applying a program voltage to a selected word line coupled to selected memory cells, thus, programming the selected memory cells to a target state among a plurality of states. The program verify operation may be an operation of applying verify voltages corresponding to at least one state of a plurality of states to the selected word line and thus verifying whether the selected memory cells have been programmed to the target state.

The program and verify circuit 150 may generate verification data including cell count values that respectively correspond to the plurality of states, based on a result of performing the program verify operation. In various embodiments, the program and verify circuit 150 may generate verification data including cell count values corresponding to one or more states of the plurality of states.

The program pulse counter 160 may count the number of times a program pulse has been applied to the selected word line during the program operation. The program pulse counter 160 may calculate a program pulse count that is the number of times a program pulse has been applied to the selected word line.

The verify table storage 170 may store reference data for determining whether the program operation is abnormal. The verify table storage 170 may store reference data corresponding to each program pulse count. The reference data may include reference cell count values that respectively correspond to the plurality of states.

The program fail detector 180 may detect whether the program operation has failed, based on a result of comparison between the verification data and the reference data.

In detail, the program fail detector 180 may determine whether the program operation has failed, depending on whether difference values between cell count values included in the verification data and reference cell count values included in the reference data fall within a threshold range. If the difference values fall within the threshold range, the program operation may be normal. If the difference values are outside the threshold range, the program operation may be abnormal. If the program operation is abnormal, the program fail detector 180 may determine that the program operation has filed. The threshold range may be set to a predetermined percentage of a reference cell count value. Alternatively, the threshold range may have a fixed value.

The program fail detector 180 may generate program fail information indicating whether the program operation has failed. The program fail detector 180 may provide the program fail information to the memory controller 200 under control of the memory controller 200.

The memory controller 200 may control overall operations of the storage device 50.

When power is applied to the storage device 50, the memory controller 200 may execute firmware (FW). In the case where the memory device 100 is a flash memory device, the memory controller 200 may execute firmware such as a flash translation layer (FTL) for controlling communication between the host and the memory device 100.

In an embodiment, the memory controller 200 may receive data and a logical block address (LBA) from the host, and translate the LBA into a physical block address (PBA) indicating addresses of memory cells to which data is to be stored, the memory cells being included in the memory device 100.

The memory controller 200 may control the memory device 100 to perform a program operation, a read operation, or an erase operation in response to a request from the host. During the program operation, the memory controller 200 may provide a write command, a PBA, and data to the memory device 100. During the read operation, the memory controller 200 may provide a read command and a PBA to the memory device 100. During the erase operation, the memory controller 200 may provide an erase command and a PBA to the memory device 100.

In an embodiment, the memory controller 200 may autonomously generate a command, an address and data without a request from the host, and transmit them to the memory device 100. For example, the memory controller 200 may provide a command, an address and data to the memory device 100 to perform background operations such as a program operation for wear leveling, and a program operation for garbage collection.

In an embodiment, the memory controller 200 may control at least two or more memory devices 100. In this case, the memory controller 200 may control the memory devices 100 in an interleaving manner so as to enhance the operating performance. The interleaving scheme may be an operating scheme of overlapping operating periods of at least two or more memory devices 100.

In an embodiment, the memory controller 200 may include a program operation controller 210. The program operation controller 210 may control the memory device 100 to perform a program operation on selected memory cells of a selected memory block. The program operation controller 210 may determine whether the program operation has failed, based on the program fail information received from the memory device 100.

If the program operation has failed, the program operation controller 210 may control the memory device 100 to copy data stored in the selected memory block to another memory block. If the copy operation is completed, the program operation controller 210 may set the selected memory block to a bad block.

Bad blocks may be classified into a manufacture bad block (MBB) which occurs during a process of manufacturing the memory device 100, and a growing bad block (GBB) which occurs during use of the memory block, according to an occurrence time of a bad block.

The host may communicate with the storage device 50 using at least one of various communication methods such as universal serial bus (USB), serial AT attachment (SATA), serial attached SCSI (SAS), high speed interchip (HSIC), small computer system interface (SCSI), peripheral component interconnection (PCI), PCI express (PCIe), nonvolatile memory express (NVMe), universal flash storage (UFS), secure digital (SD), multimedia card (MMC), embedded MMC (eMMC), dual in-line memory module (DIMM), registered DIMM (RDIMM), and load reduced DIMM (LRDIMM) communication methods.

Figure 2:
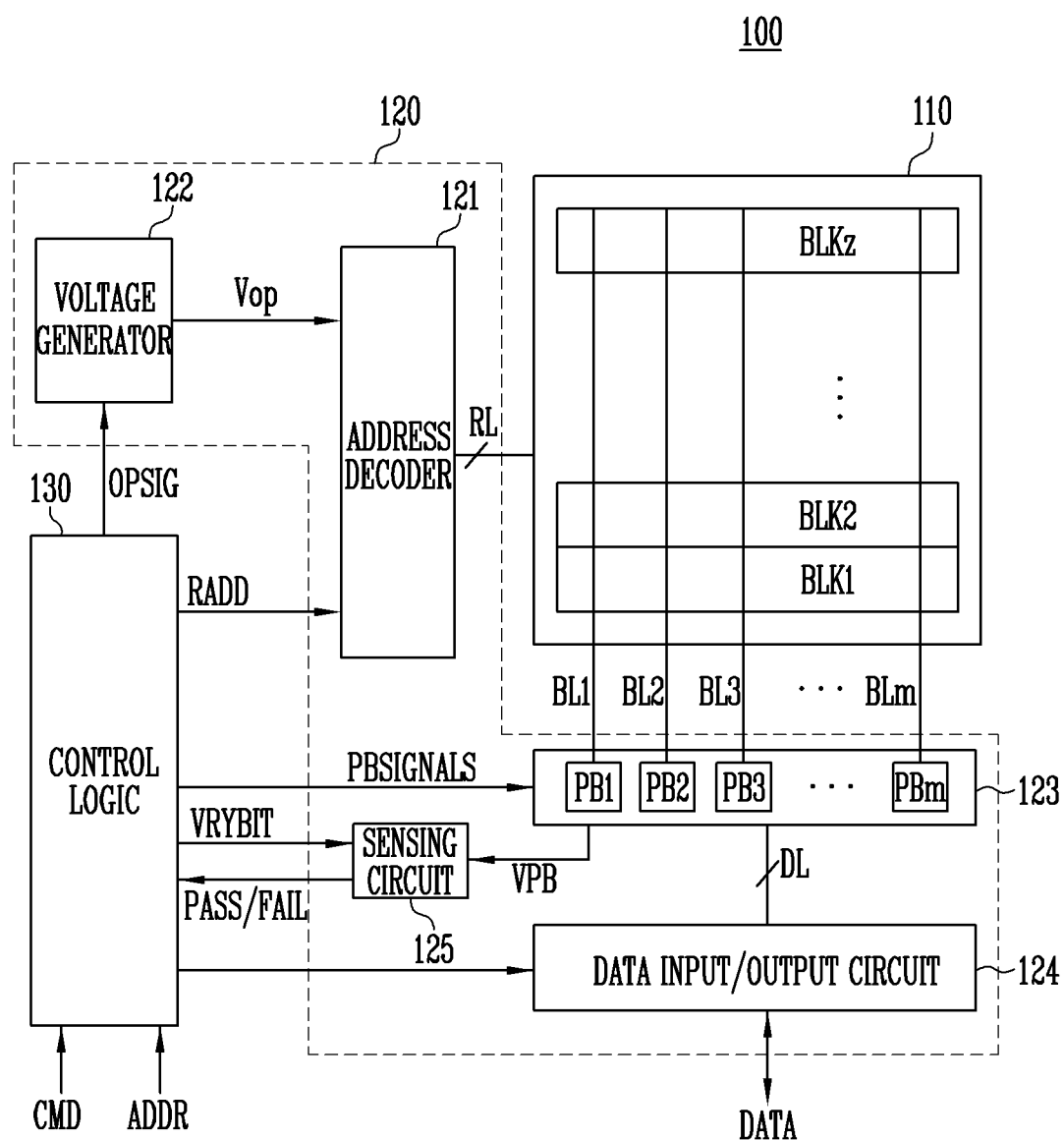
FIG. 2 is a diagram illustrating the configuration of a memory device of FIG. 1.

FIG. 2 is a diagram illustrating the configuration of the memory device 100 of FIG. 1.

Referring to FIG. 2, the memory device 100 may include a memory cell array 110, a peripheral circuit 120, and a control logic 130.

The memory cell array 110 may include a plurality of memory blocks BLK1 to BLKz. The plurality of memory blocks BLK1 to BLKz are coupled to the address decoder 121 through the row lines RL. The memory blocks BLK1 to BLKz may be coupled to the read/write circuit 123 through bit lines BL1 to BLm. Each of the memory blocks BLK1 to BLKz may include a plurality of memory cells. In an embodiment, the plurality of memory cells may be nonvolatile memory cells. Memory cells coupled to the same word line among the plurality of memory cells are defined as one page. In other words, the memory cell array 110 may be formed of a plurality of physical pages. In an embodiment, each of the memory blocks BLK1 to BLKz included in the memory cell array 110 may include a plurality of dummy cells. One or more dummy cells may be coupled in series between a drain select transistor and memory cells and between a source select transistor and the memory cells.

Each of the memory cells of the memory device 100 may be formed of a single-level cell (SLC) capable of storing a single data bit, a multi-level cell (MLC) capable of storing two data bits, a triple-level cell (TLC) capable of storing three data bits, or a quad-level cell (QLC) capable of storing four data bits.

The peripheral circuit 120 may include an address decoder 121, a voltage generator 122, a read/write circuit 123, a data input/output circuit 124, and a sensing circuit 125.

The peripheral circuit 120 may drive the memory cell array 110. For example, the peripheral circuit 120 may drive the memory cell array 110 to perform a program operation, a read operation, or an erase operation.

The address decoder 121 is coupled to the memory cell array 110 through the row lines RL. The row lines RL may include drain select lines, word lines, source select lines, and a common source line. In an embodiment, the word lines may include normal word lines and dummy word lines. In an embodiment, the row lines RL may further include a pipe select line.

In an embodiment, the row lines RL may be local lines included in local line groups. Each local line group may correspond to one memory block. The local line group may include a drain select line, local word lines, and a source select line.

The address decoder 121 may operate under control of the control logic 130. The address decoder 121 may receive addresses ADDR from the control logic 130.

The address decoder 121 may decode a block address among the received addresses ADDR. The address decoder 121 may select at least one of the memory blocks BLK1 to BLKz according to the decoded block address. The address decoder 121 may decode a row address RADD among the received addresses ADDR. The address decoder 121 may select at least one word line WL of the selected memory block by applying voltages supplied from the voltage generator 122 to at least one word line WL according to the decoded row address RADD.

During a program operation, the address decoder 121 may apply a program voltage to a selected word line and apply a pass voltage having a level lower than that of the program voltage to unselected word lines. During a program verify operation, the address decoder 121 may apply a verify voltage to a selected word line and apply a verify pass voltage having a level higher than that of the verify voltage to unselected word lines.

During a read operation, the address decoder 121 may apply a read voltage to a selected word line and apply a read pass voltage having a level higher than that of the read voltage to unselected word lines.

In an embodiment, an erase operation of the memory device 100 may be performed on a memory block basis. During the erase operation, an address ADDR to be input to the memory device 100 includes a block address. The address decoder 121 may decode the block address and select a corresponding memory block according to the decoded block address. During the erase operation, the address decoder 121 may apply a ground voltage to word lines coupled to the selected memory block.

In an embodiment of the present disclosure, the address decoder 121 may decode a column address among the transmitted addresses ADDR. The decoded column address may be transmitted to the read/write circuit 123. For example, the address decoder 121 may include components such as a row decoder, a column decoder, and an address buffer.

The voltage generator 122 may generate a plurality of operating voltages Vop using an external supply voltage supplied to the memory device 100. The voltage generator 122 may operate under control of the control logic 130.

In an embodiment, the voltage generator 122 may generate an internal supply voltage by regulating the external supply voltage. The internal supply voltage generated from the voltage generator 122 may be used as an operating voltage of the memory device 100.

In an embodiment, the voltage generator 122 may generate a plurality of operating voltages Vop using an external supply voltage or an internal supply voltage. The voltage generator 122 may generate various voltages required from the memory device 100. For example, the voltage generator 122 may generate a plurality of erase voltages, a plurality of program voltages, a plurality of pass voltages, a plurality of select read voltages, and a plurality of unselect read voltages.

The voltage generator 122 may include, so as to generate a plurality of operating voltages Vop having various voltage levels, a plurality of pumping capacitors configured to receive an internal supply voltage, and may generate a plurality of operating voltages Vop by selectively enabling the plurality of pumping capacitors under control of the control logic 130.

The generated operating voltages Vop may be supplied to the memory cell array 110 by the address decoder 121.

The read/write circuit 123 may include first to m-th page buffers PB1 to PBm. The first to m-th page buffers PB1 to PBm may be coupled to the memory cell array 110 through the first to m-th bit lines BL1 to BLm, respectively. The first to m-th page buffers PB1 to PBm may operate under control of the control logic 130.

The first to m-th page buffers PB1 to PBm may communicate data DATA with the data input/output circuit 124. During a program operation, the first to m-th page buffers PB1 to PBm may receive data DATA to be stored through the data input/output circuit 124 and data lines DL.

During a program operation, the first to m-th page buffers PB1 to PBm may transmit the data DATA, received through the data input/output circuit 124, to selected memory cells through the bit lines BL1 to BLm when a program voltage is applied to a selected word line. The memory cells in the selected page are programmed based on the transmitted data DATA. Memory cells coupled to a bit line to which a program enable voltage (e.g. a ground voltage) is applied may have increased threshold voltages. Threshold voltages of memory cells coupled to a bit line to which a program inhibit voltage (for example, a supply voltage) is applied may be retained. During a program verify operation, the first to m-th page buffers PB1 to PBm may read data DATA from selected memory cells through the bit lines BL1 to BLm.

During a read operation, the read/write circuit 123 may read data DATA from the memory cells of the selected page through the bit lines BL, and store the read data DATA in the first to m-th page buffers PB1 to PBm.

During an erase operation, the read/write circuit 123 may float the bit lines BL. In an embodiment, the read/write circuit 123 may include a column select circuit.

The data input/output circuit 124 is coupled to the first to m-th page buffers PB1 to PBm through the data lines DL. The data input/output circuit 124 may operate under control of the control logic 130.

The data input/output circuit 124 may include a plurality of input/output buffers (not shown) for receiving input data DATA. During a program operation, the data input/output circuit 124 may receive data DATA to be stored from an external controller (not shown). During a read operation, the data input/output circuit 124 may output, to the external controller, the data DATA received from the first to m-th page buffers PB1 to PBm included in the read/write circuit 123.

During a read operation or a verify operation, the sensing circuit 125 may generate reference current in response to an enable bit signal VRYBIT generated by the control logic 130, compare a sensing voltage VPB received from the read/write circuit 123 with a reference voltage generated by the reference current, and output a pass signal or a fail signal to the control logic 130.

The control logic 130 may be coupled to the address decoder 121, the voltage generator 122, the read/write circuit 123, the data input/output circuit 124, and the sensing circuit 125. The control logic 130 may control the overall operation of the memory device 100. The control logic 130 may operate in response to a command CMD transmitted from an external device.

The control circuit 130 may generate various signals in response to the command CMD and the address ADD and control the peripheral circuit 120. For example, the control logic 130 may generate an operating signal OPSIG, a row address RADD, a read/write circuit control signal PBSIGNALS, and an enable bit VRYBIT in response to the command CMD and the address ADD. The control logic 130 may output the operating signal OPSIG to the voltage generation unit 122, output the row address RADD to the address decoder 121, output the read/write control signal to the read/write circuit 123, and output the enable bit VRYBIT to the sensing circuit 125. Furthermore, the control logic 130 may determine whether target memory cells have passed or failed a verification during the verify operation in response to a pass signal PASS or a fail signal FAIL that is output from the sensing circuit 125.

In an embodiment, the peripheral circuit 120 may include the program and verify circuit of FIG. 1. The control logic 130 may include the program pulse counter, the verify table storage, and the program fail detector of FIG. 1.

Figure 3:
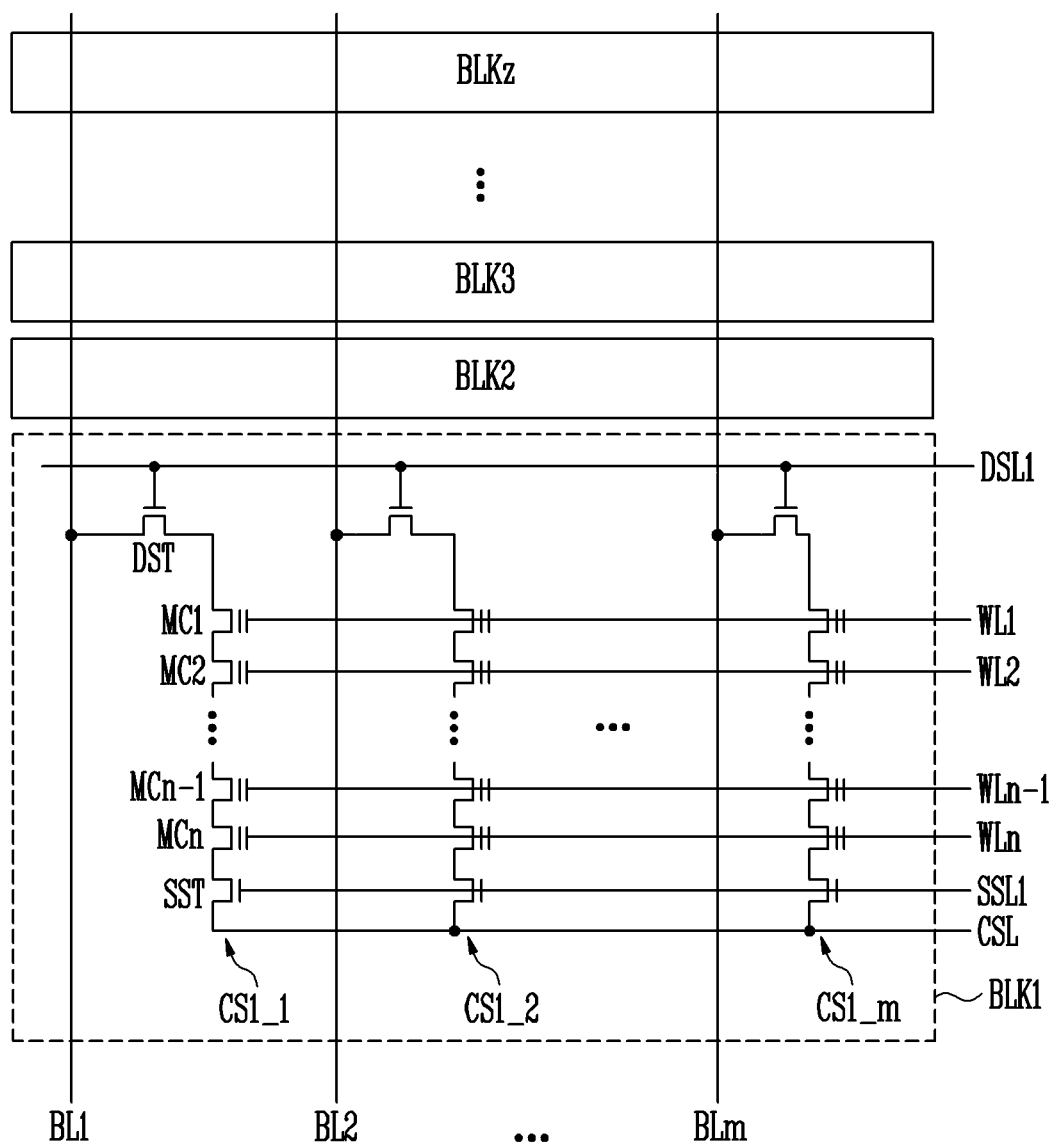
FIG. 3 is a diagram illustrating a memory cell array of FIG. 2.

FIG. 3 is a diagram illustrating the memory cell array 110 of FIG. 2.

Referring to FIG. 3, the first to z-th memory blocks BLK1 to BLKz are connected in common to the first to m-th bit lines BL1 to BLm. In FIG. 3, elements of only the first memory block BLK1 among the plurality of memory blocks BLK1 to BLKz are illustrated, and an illustration of elements of each of the other memory blocks BLK2 to BLKz is omitted. It will be understood that each of the memory blocks BLK2 to BLKz has the same configuration as that of the first memory block BLK1.

The memory block BLK1 may include a plurality of cell strings CS1_1 to CS1_m (m is a positive integer). The first to m-th cell strings CS1_1 to CS1_m are respectively coupled to the first to m-th bit lines BL1 to BLm. Each of the first to m-th cell strings CS1_1 to CS1_m includes a drain select transistor DST, a plurality of memory cells MC1 to MCn (n is a positive integer) coupled in series to each other, and a source select transistor SST.

A gate terminal of the drain select transistor DST included in each of the first to m-th cell strings CS1_1 to CS1_m is coupled to a drain select line DSL1. Gate terminals of the first to n-th memory cells MC1 to MCn included in each of the first to m-th cell strings CS1_1 to CS1_m are respectively coupled to the first to n-th word lines WL1 to WLn. A gate terminal of the source select transistor SST included in each of the first to m-th cell strings CS1_1 to CS1_m is coupled to a source select line SSL1.

The configuration of each cell string will be described based on the first cell string CS1_1 of the plurality of cell strings CS1_1 to CS1_m. It will be understood that each of the other cell strings CS1_2 to CS1_m has the same configuration as that of the first cell string CS1_1.

A drain terminal of the drain select transistor DST included in the first cell string CS1_1 is coupled to the first bit line BL1. A source terminal of the drain select transistor DST included in the first cell string CS1_1 is coupled to a drain terminal of the first memory cell MC1 included in the first cell string CS1_1. The first to n-th memory cells MC1 to MCn are coupled in series to each other. A drain terminal of the source select transistor SST included in the first cell string CS1_1 is coupled to a source terminal of the n-th memory cell MCn included in the first cell string CS1_1. A source terminal of the source select transistor SST included in the first cell string CS1_1 is coupled to a common source line CSL. In an embodiment, the common source line CSL may be coupled in common to the first to z-th memory blocks BLK1 to BLKz.

The drain select line DSL1, the first to n-th word lines WL1 to WLn, and the source select line SSL1 are included in the row lines RL of FIG. 2. The drain select line DSL1, the first to n-th word lines WL1 to WLn, and the source select line SSL1 are controlled by the address decoder 121. The common source line CSL is controlled by the control logic 130. The first to m-th bit lines BL1 to BLm are controlled by the read/write circuit 123.

Figure 4:
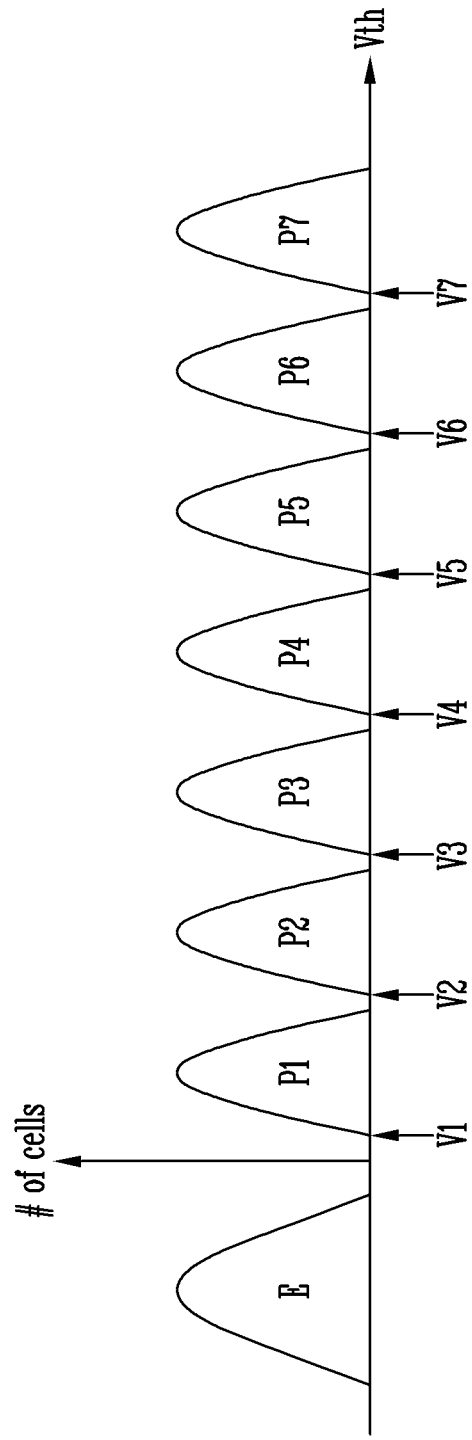
FIG. 4 is a diagram illustrating threshold voltage distributions of memory cells and verify voltages in accordance with an embodiment.

FIG. 4 is a diagram illustrating threshold voltage distributions of memory cells and verify voltages in accordance with an embodiment.

Referring to FIG. 4, each of the memory cells may be programmed to any one state of a plurality of states. The plurality of states may be determined based on the number of data bits stored in a memory cell.

Description with reference to FIG. 4 will be made based on each memory cell being a triple-level cell (TLC) capable of storing three data bits. However, the number of data bits that may be stored in each memory cell is not limited to that of this embodiment of the present disclosure.

Each memory cell may be programmed to a target state among an erased state E and first to seventh programmed states P1 to P7. The target state may be determined depending on data to be programmed to the memory cell.

A verify voltage corresponding to the target state may be a voltage for verifying whether the memory cell has been programmed to the target state. A memory cell that has a threshold voltage higher than the verify voltage corresponding to the target state may be a memory cell that has passed a verification. A memory cell that has a threshold voltage lower than the verify voltage corresponding to the target state may be a memory cell that has failed a verification.

The verify voltage corresponding to the target state may be a voltage that corresponds to a left tail of a threshold voltage distribution related with the target state.

A plurality of verify voltages may respectively correspond to the plurality of states. For example, first to seventh verify voltages V1 to V7 may respectively correspond to the first to seventh programmed states P1 to P7.

In an embodiment, a cell count value corresponding to each of the plurality of states may be the number of memory cells included in a threshold voltage section defined by a plurality of verify voltages. A cell count value corresponding to any one state may be the number of memory cells included in a threshold voltage section defined by adjacent verify voltages.

For example, a cell count value corresponding to the first programmed state P1 may be the number of memory cells included in a threshold voltage section defined by adjacent verify voltages V1 and V2.

In various embodiments, a cell count value corresponding to each of the plurality of states may be the number of memory cells included in a corresponding one of the plurality of threshold voltage distributions. For example, a cell count value corresponding to the first programmed state P1 may be the number of memory cells included in the threshold voltage distribution corresponding to the first programmed state P1.

Figure 5:
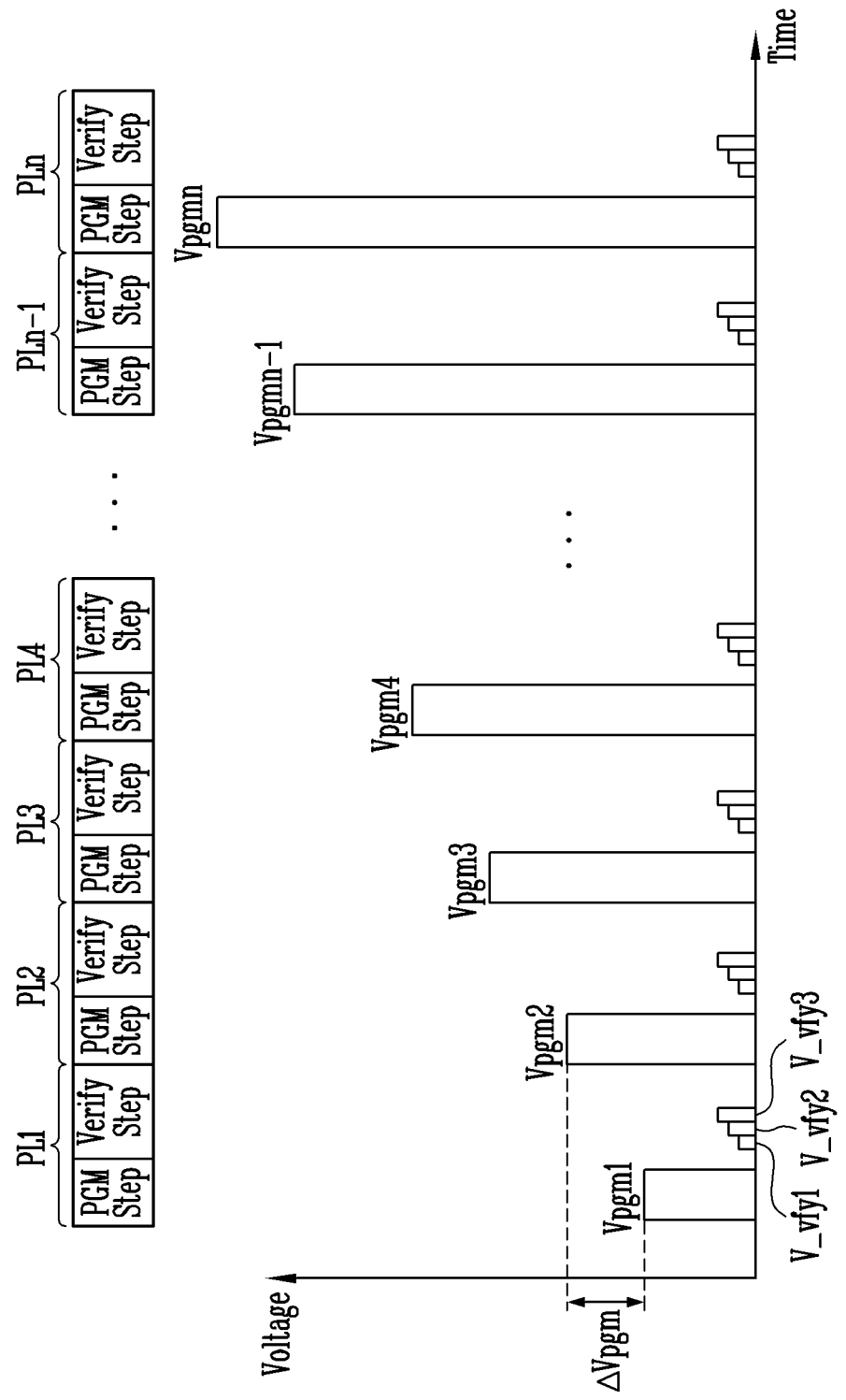
FIG. 5 is a diagram for describing a program operation in accordance with an embodiment.

FIG. 5 is a diagram for describing a program operation in accordance with an embodiment.

Referring to FIG. 5, the program operation may include a plurality of program loops PL1 to PLn (n is a natural number of 1 or more). The memory device may perform a plurality of program loops to program selected memory cells such that the memory cells have a target state among the plurality of programmed states.

Each of the plurality of program loops may include program voltage application step (PGM Step) and a verify step (Verify Step).

At the program voltage application step, a program pulse application operation of applying a program voltage to a selected word line coupled with the selected memory cells may be performed. Each of the selected memory cells may be programmed to a target state of the plurality of states by a program pulse application operation. The target state may be determined depending on data to be programmed to the selected memory cells.

At the verify step, a program verify operation of determining whether the selected memory cells have been programmed by applying verify voltages to the selected word line may be performed.

In an embodiment, a program voltage may be determined according to an incremental step pulse programming (ISPP) scheme. In other words, the level of the program voltage may be increased or reduced in steps by a predetermined voltage increment as the program loops are repeated. The number of times of application, the voltage level, the voltage application time, etc. of a program voltage to be used in each program loop may be determined in various ways under control of the memory controller.

A pass voltage may be applied to unselected word lines that are word lines other than the selected word line. In an embodiment, pass voltages having the same level may be applied to the unselected word lines. In an embodiment, the level of a pass voltage may vary depending on the location of a word line.

A ground voltage may be applied, as a program enable voltage, to selected bit lines coupled to memory cells to be programmed. A program inhibit voltage may be applied to unselected bit lines that are bit lines coupled with memory cells other than the memory cells to be programmed.

At the program verify step, the memory device may apply a verify voltage to the selected word line and apply a verify pass voltage to the unselected word lines. The memory device may detect voltage or current that is output through the bit lines to which the memory cells coupled to the selected word line are respectively coupled, and may determine whether the verify step has passed or failed based on a result of the detection.

At the program voltage application step, each of the selected memory cells may be programmed to any one state of first to m-th states (m is a natural number of 1 or more).

At the verify step, a program verify operation for at least one state of the first to m-th states may be performed. For example, if memory cells to be programmed to a k-th state (k is a natural number ranging from 1 to m) among the selected memory cells are determined to be off-cells by a verify voltage corresponding to the k-th state, a program verify operation for the k-th state may pass.

In FIG. 5, if each of the selected memory cells is a multi-level cell (MLC) capable of storing two data bits, each of the selected memory cells may be programmed to any one state among the erased state and the first to third programmed states. The number of data bits that may be stored in each memory cell is not limited to that of this embodiment of the present disclosure.

When a first program loop PL1 is performed, a first program voltage Vpgm1 is applied and, thereafter, first to third verify voltages V_vfy1 to V_vfy3 are sequentially applied to verify programmed states of the memory cells. Here, the first verify voltage V_vfy1 may be used to perform a verify operation on memory cells of which the target state is the first programmed state. The second verify voltage V_vfy2 may be used to perform a verify operation on memory cells of which the target state is the second programmed state. The third verify voltage V_vfy3 may be used to perform a verify operation on memory cells of which the target state is the third programmed state. The number of verify voltages is not limited to that of the present embodiment.

Memory cells that have passed the verify operation by the corresponding verify voltages V_vfy1 to V_vfy3 are determined to have the corresponding target states, and thereafter may be program-inhibited in the second program loop PL2. The program inhibit voltage may be applied to bit lines coupled with the program-inhibited memory cells. During the second program loop PL2, a second program voltage Vpgm2 higher than the first program voltage Vpgm1 by a unit voltage ΔVpgm may be applied to the selected word line.

Subsequently, a verify operation is performed in the same manner as the verify operation of the first program loop PL1. For example, "verify pass" indicates that a memory cell is determined to be an off-cell by a corresponding verify voltage.

As described above, when the memory device programs multi-level cells (MLCs), the memory device may verify, using the first to third verify voltages V_vfy1 to V_vfy3, the memory cells of which the target states are respective corresponding programmed states.

In various embodiments, if the program operation is not completed within a predetermined number of program loops, the program operation may be determined to fail. If the program operation is completed within the predetermined number of program loops, the program operation may pass. The completion of the program operation may be determined depending on whether all program verify operations on the selected memory cells have passed. If all of the program verify operations pass, a subsequent program loop may not be performed.

In an embodiment, a program loop count may be the number of program loops performed during the program operation. In various embodiments, the program loop count may be a program pulse count that is the number of times a program pulse has been applied to the selected word line during the program operation.

In an embodiment, if each of the memory cells is a triple-level cell described with reference to FIG. 4, at a verify step, a program verify operation may be performed using at least one or more verify voltages among a plurality of verify voltages V1 to V7 that respectively correspond to the first to seventh programmed states P1 to P7. In other words, at the verify step of each program loop, a program verify operation for one or more states may be performed.

Figure 6:
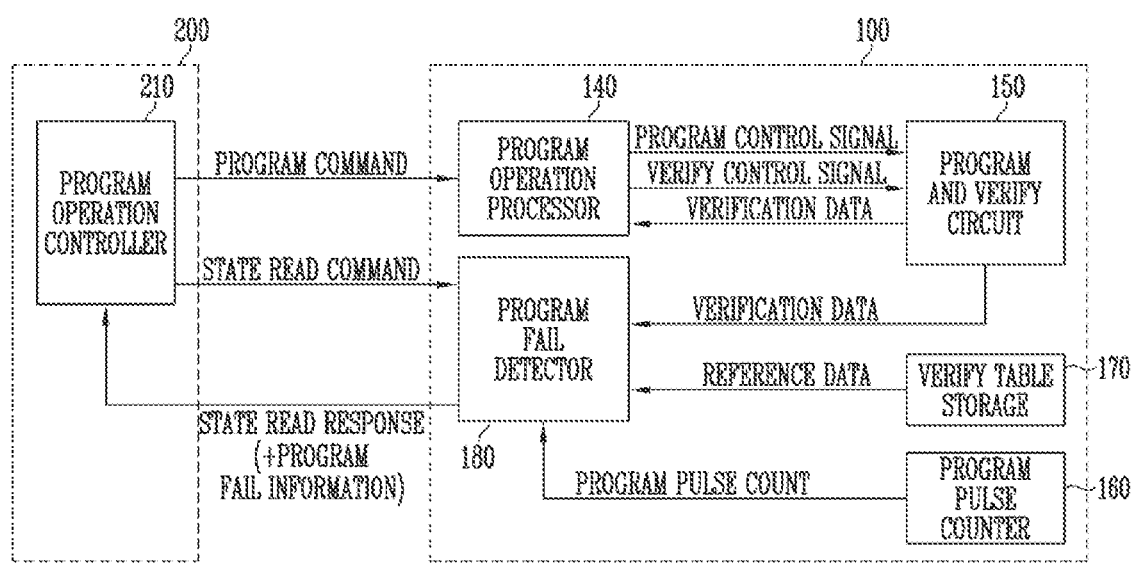
FIG. 6 is a diagram for describing the configuration and operation of the storage device of FIG. 1.

FIG. 6 is a diagram for describing the configuration and operation of the storage device of FIG. 1.

Referring to FIG. 6, the storage device may include a memory device 100 and a memory controller 200.

In an embodiment, the memory device 100 may include a program operation processor 140, a program and verify circuit 150, a program pulse counter 160, a verify table storage 170, and a program fail detector 180.

The program operation processor 140 may generate a program control signal and a verify control signal in response to a program command received from the program operation controller 210. The program operation processor 140 may provide the program control signal and the verify control signal to the program and verify circuit 150.

The program operation processor 140 may control, using the program control signal, the program and verify circuit 150 to perform a program operation. The program operation processor 140 may control, using the verify control signal, the program and verify circuit 150 to perform a program verify operation.

During each program loop, the program operation processor 140 may receive, from the program and verify circuit 150, verification data that is a result of performing a program verify operation. The program operation processor 140 may determine, based on the received verification data, whether to perform a subsequent program loop described with reference to FIG. 5, and may determine a program voltage and verify voltages of the subsequent program loop.

In an embodiment, the program operation processor 140 may be included in the control logic 130 described with reference to FIG. 2.

The program and verify circuit 150 may perform, in response to a program control signal, a program operation of programming selected memory cells to a target state of a plurality of states. The program and verify circuit 150 may perform, in response to a verify control signal, a program verify operation of verifying whether the selected memory cells have been programmed to the target state.

The program and verify circuit 150 may generate verification data indicating a result of performing the program verify operation. The verification data may include cell count values that respectively correspond to one or more states among the plurality of states. In various embodiments, the verification data may include the number of memory cells that are determined to be on-cells by at least one or more verify voltages among a plurality of verify voltages that respectively correspond to the plurality of states.

The program and verify circuit 150 may provide the verification data to the program operation processor 140 and the program fail detector 180.

The program pulse counter 160 may count the number of times a program pulse has been applied to a selected word line coupled with selected memory cells during a program operation. The program pulse counter 160 may calculate a program pulse count that is the number of times a program pulse has been applied to the selected word line, and provide the program pulse count to the program fail detector 180.

The verify table storage 170 may store reference data corresponding to each program pulse count. The verify table storage 170 may provide the reference data to the program fail detector 180. The reference data may include reference cell count values that respectively correspond to the plurality of states and are used to determine whether the program operation is abnormal.

The program fail detector 180 may detect whether the program operation has failed, based on a result of comparison between the verification data and the reference data.

In detail, the program fail detector 180 may compare the reference cell count values with cell count values that respectively correspond to one or more states and are included in the verification data. The program fail detector 180 may determine whether the program operation has failed depending on whether difference values between the cell count values and the reference cell count values are within the threshold range.

If the difference values are within the threshold range, the program fail detector 180 may determine that the program operation is normal. If the difference values are outside the threshold range, the program fail detector 180 may determine that the program operation is abnormal. If it is determined that the program operation is abnormal, the program operation may be determined to fail. The threshold range may be set to a predetermined percentage of a reference cell count value. Alternatively, the threshold range may have a fixed value.

The program fail detector 180 may generate program fail information indicating whether the program operation has failed. The program fail detector 180 may provide a state read response to the program operation controller 210 in response to a state read command received from the program operation controller 210. The state read response may include the program fail information.

In an embodiment, the memory controller 200 may include the program operation controller 210.

The program operation controller 210 may provide, to the program operation processor 140, a program command for performing a program operation on selected memory cells of a selected memory block. The program operation controller 210 may provide, to the program fail detector 180, a state read command for determining whether the program operation has failed. The program operation controller 210 may determine whether the program operation has failed, based on program fail information included in a state read response received from the program fail detector 180.

If the program operation has failed, the program operation controller 210 may control the memory device 100 to copy data stored in the selected memory block to another memory block. The program operation controller 210 may provide, to the program operation processor 140, a program command for storing data read from the selected memory block to another memory block. The program operation controller 210 may set the selected memory block to a bad block if the operation of copying the data stored in the selected memory block to another memory block has been completed.

FIG. 7 is a diagram for describing reference data and verification data in accordance with an embodiment.

Referring to FIG. 7, the verify table storage may store a verify table. The verify table may include the reference data corresponding to each program pulse count.

The reference data may include reference cell count values that respectively correspond to the plurality of states. Referring to FIGS. 4 and 5, the reference cell count values may be predicted values based on the number of times a program pulse has been applied, the level of the program pulse, an increment of the program pulse, the width of an initial threshold voltage distribution corresponding to an erased state before the program operation, etc.

The verification data may include actual cell count values that respectively correspond to the plurality of states and are obtained as a result of performing a program verify operation.

Referring to FIG. 7, description will be made based on each selected memory cell being a TLC, and the number of selected memory cells is 8000. Therefore, in the case of an initial state in which no program pulse is applied, the program pulse count may be 0 (not illustrated), and the reference cell count value corresponding to the erased state E may be 8000. The number of data bits that are stored in each memory cell and the number of selected memory cells are not limited to those of the present embodiment.

It may be determined whether cell count values that respectively correspond to the plurality of states E and P1 to P7 are normal, based on a result of comparison between the reference data and the verification data.

For example, when the program pulse count is 2, the reference cell count values that respectively correspond to the plurality of states E and P1 to P7 may be respectively 1000, 1500, 4500, 800, 180, 20, 0, and 0, as illustrated in FIG. 7. Included in the verification data, the cell count values that respectively correspond to the plurality of states E and P1 to P7 may be respectively 1000, 1500, 4400, 850, 190, 20, 40, and 0, as illustrated in FIG. 7.

It may be determined whether the cell count values are normal depending on whether difference values between the cell count values and the reference cell count values that correspond to the respective states are within the threshold range. The threshold range may be set to a predetermined percentage of the reference cell count values or a fixed value. In FIG. 7, description will be made based on the threshold range being 10% of the reference cell count values. Here, the predetermined rate may be set to various values.

The reference cell count value corresponding to the erase state E is 1000, and the threshold range is 100 which is 10% of 1000. Hence, if the cell count value ranges from 900 to 1100, the cell count value may be determined to be normal. Since the cell count value is 1000, it is normal.

The reference cell count value corresponding to the first programmed state P1 is 1500, and the threshold range is 150 which is 10% of 1500. Hence, if the cell count value ranges from 1350 to 1650, the cell count value may be determined to be normal. Since the cell count value is 1500, it is normal.

The reference cell count value corresponding to the second programmed state P2 is 4500, and the threshold range is 450 which is 10% of 4500. Hence, if the cell count value ranges from 4050 to 4950, the cell count value may be determined to be normal. Since the cell count value is 4400, it is normal.

The reference cell count value corresponding to the third programmed state P3 is 800, and the threshold range is 80 which is 10% of 800. Hence, if the cell count value ranges from 720 to 880, the cell count value may be determined to be normal. Since the cell count value is 850, it is normal.

The reference cell count value corresponding to the fourth programmed state P4 is 180, and the threshold range is 18 which is 10% of 180. Hence, if the cell count value ranges from 162 to 198, the cell count value may be determined to be normal. Since the cell count value is 190, it is normal.

The reference cell count value corresponding to the fifth programmed state P5 is 20, and the threshold range is 2 which is 10% of 20. Hence, if the cell count value ranges from 18 to 22, the cell count value may be determined to be normal. Since the cell count value is 20, it is normal.

Each of the reference cell count values corresponding to the sixth and seventh programmed states P6 and P7 may be 0. Since the cell count value corresponding to the sixth programmed state P6 is 40, it is abnormal.

Since the cell count value corresponding to the sixth programmed state P6 is abnormal as a result of the comparison between the reference data and the verification data, the sixth programmed state P6 may be determined to be an abnormal programmed state. Therefore, the program operation may be determined to fail.

In various embodiments, it may be determined whether cell count values that respectively correspond to one or more states of the plurality of states E and P1 to P7 are normal. If the cell count value corresponding to any one state of the one or more states is abnormal, the program operation may be determined to have failed.

Figure 8:
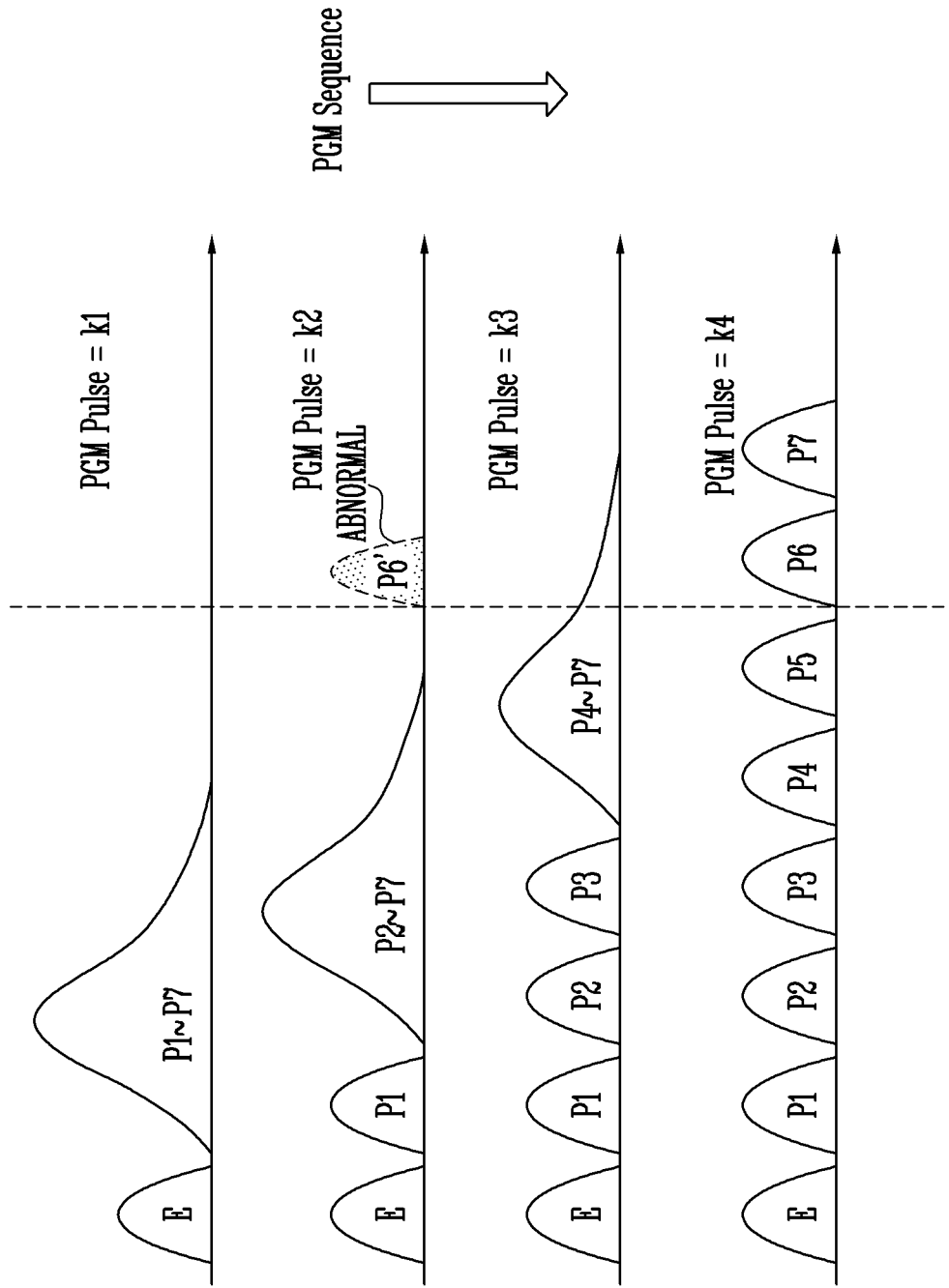
FIG. 8 is a diagram for describing an operation of detecting a failure of a program operation in accordance with an embodiment.

FIG. 8 is a diagram for describing an operation of detecting a failure of a program operation in accordance with an embodiment.

FIG. 8 illustrates a process of forming threshold voltage distributions of selected memory cells according to a proceeding process of the program operation.

For example, when the program pulse count is k1 (k1 is a natural number of 1 or more), formation of a threshold voltage distribution corresponding to the erased state E may be completed. Threshold voltage distributions corresponding to the first to seventh programmed states P1 to P7 may be formed.

When the program pulse count is k2 (k2 is a natural number greater than k1), formation of the threshold voltage distributions that correspond to the erased state E and the first programmed state P1 may be completed. Threshold voltage distributions corresponding to the second to seventh programmed states P2 to P7 may be formed.

When the program pulse count is k3 (k3 is a natural number greater than k2), formation of the threshold voltage distributions that correspond to the erased state E and the first to third programmed states P1 to P3 may be completed. Threshold voltage distributions corresponding to the fourth to seventh programmed states P4 to P7 may be formed.

When the program pulse count is k4 (k4 is a natural number greater than k3), formation of the threshold voltage distributions that correspond to the erased state E and the first to seventh programmed states P1 to P7 may be completed. In other words, formation of the threshold voltage distributions of all of the programmed states may be completed.

The reference cell count value corresponding to each state may be changed depending on the program pulse count. For example, if the number of selected memory cells is 8000, a cell count value corresponding to each state after the entire program operation has been completed may be 1000. In this case, when the program pulse count is k2, a reference cell count value corresponding to a sixth programmed state P6' may be 0. When the program pulse count is k4, a reference cell count value corresponding to the sixth programmed state P6 may be 1000.

If the cell count value corresponding to the sixth programmed state P6' is 40 when the program pulse count is k2, the cell count value may be abnormal. This may mean that, compared to the degree to which the program operation has proceeded, cells to be programmed to the sixth programmed state P6' are abnormally programmed with the lower program pulse count. If the cell count value corresponding to the sixth programmed state P6 is 1000 when the program pulse count is k4, the cell count value may be normal.

In this case, if it is determined whether the cell count value corresponding to each state is normal after the entire program operation has been completed, an abnormal programmed state that has occurred during the program operation may not be detected. Such an abnormal programmed state may be caused by various reasons such as characteristics of memory cells, and a defect of a word line or a bit line.

In an embodiment of the present disclosure, it may be determined whether the cell count value corresponding to each state for each program pulse count is normal. In other words, an abnormal programmed state that has occurred during the program operation may be easily detected.

In various embodiments, it may be determined whether an abnormal programmed state in which memory cells are abnormally programmed with a lower or higher program pulse count compared to the degree to which the program operation has proceeded has occurred. If an abnormal programmed state occurs, the program operation may be determined to fail.

Figure 9:
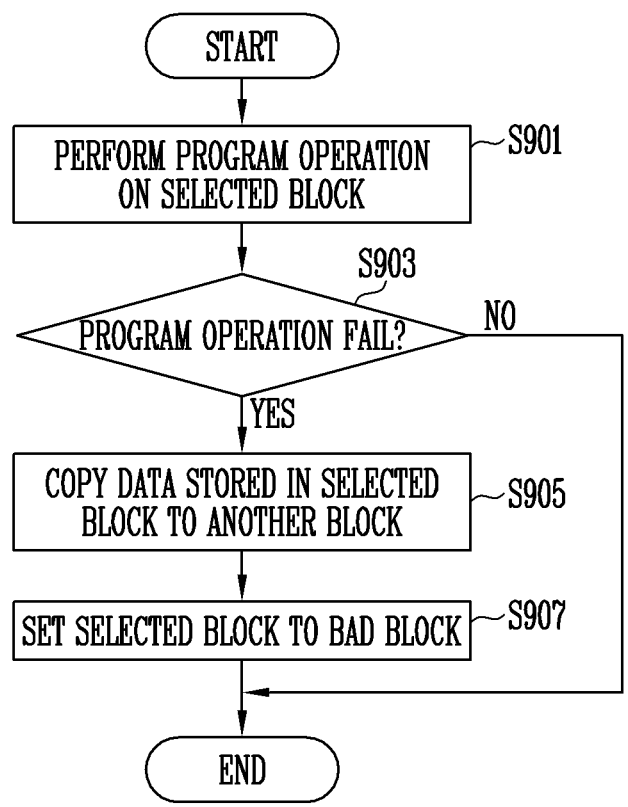
FIG. 9 is a flowchart for describing an operation of the storage device in accordance with an embodiment.

FIG. 9 is a flowchart for describing an operation of the storage device in accordance with an embodiment.

Referring to FIG. 9, at step S901, the storage device may perform a program operation on a selected block.

At step S903, the storage device may determine whether the program operation has failed. If the program operation has failed as a result of the determination, the process proceeds to step S905. If the program operation has passed, the storage device terminates the operation.

Fail or pass of the program operation may be determined based on a result of comparison between verification data and reference data according to each program pulse count.

The reference data may include reference cell count values that respectively correspond to a plurality of states. The verification data may include cell count values that respectively correspond to one or more states among the plurality of states.

At step S905, the storage device may copy data stored in the selected block to another block.

At step S907, the storage device may set the selected block to a bad block.

Figure 10:
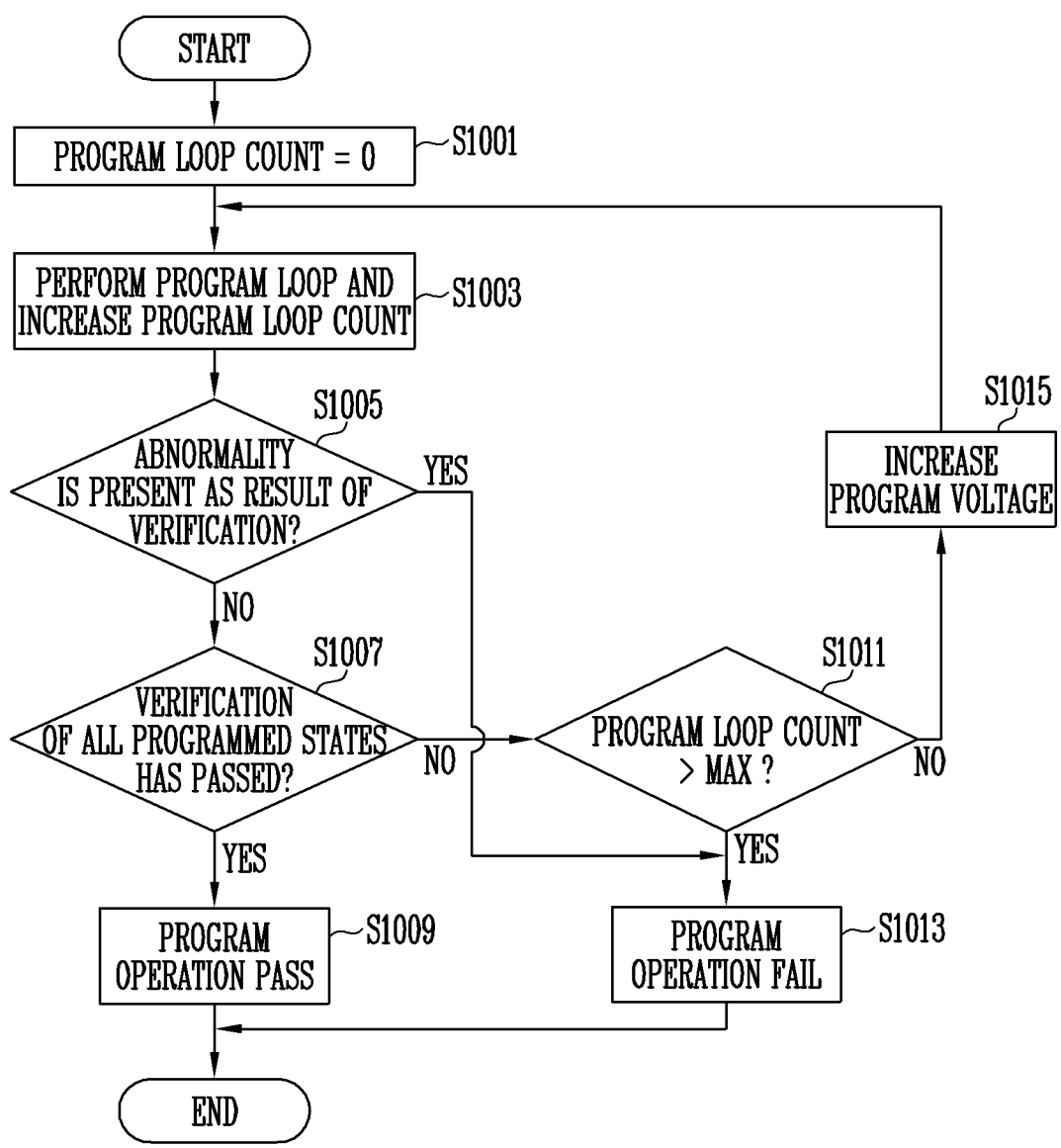
FIG. 10 is a flowchart for describing a program operation in accordance with an embodiment.

FIG. 10 is a flowchart for describing a program operation in accordance with an embodiment.

Referring to FIG. 10, at step S1001, a program loop count may be set to 0. The program loop count may be the number of times a program pulse has been applied to a selected word line coupled with selected memory cells.

At step S1003, a program loop may be performed, and the program loop count may be increased. The program loop may include a program voltage application step and a verify step, as described with reference to FIG. 5. At the verify step, a program verify operation using at least one or more verify voltages among a plurality of verify voltages that respectively correspond to a plurality of states may be performed.

At step S1005, it may be determined whether the program operation is abnormal according to a result of the program verify operation. If the program operation is abnormal, the process proceeds to step S1013. If the program operation is normal, the process proceeds to step S1007.

At step S1007, it may be determined whether the program operation for all of the programmed states have passed. As a result of the determination, if the program operation for all of the programmed states have passed, the process proceeds to step S1009. If the program operation for at least one program state has not passed, the process proceeds to step S1011.

At step S1009, the program operation may be determined to have passed.

At step S1011, it may be determined whether the program loop count exceeds a preset maximum program loop count. As a result of the determination, if the program loop count exceeds the maximum program loop count, the process proceeds to step S1013. If the program loop count is less than or equal to the maximum program loop count, the process proceeds to step S1015.

At step S1013, the program operation may be determined to have failed.

At step S1015, the program voltage to be applied to the selected word line during a subsequent program loop may be increased. In detail, the program voltage may be increased according to the incremental step pulse program (ISPP) scheme described with reference to FIG. 5.

Figure 11:
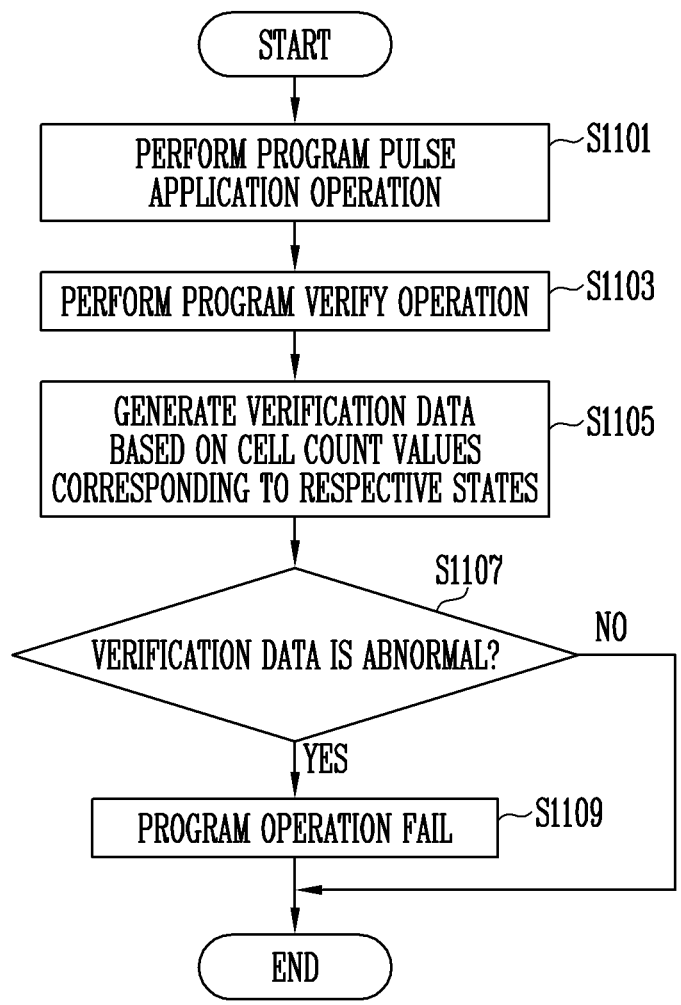
FIG. 11 is a flowchart for describing a program loop and a verify result abnormality determination operation of FIG. 10.

FIG. 11 is a flowchart for describing a program loop and a verify result abnormality determination operation of FIG. 10.

Referring to FIG. 11, at step S1101, a program pulse application operation may be performed. At step S1103, a program verify operation may be performed.

At step S1105, verification data may be generated based on cell count values that respectively correspond to the respective states. The verification data may include cell count values that respectively correspond to the plurality of states to which selected memory cells are to be programmed. Alternatively, the verification data may include cell count values that respectively correspond to one or more states among the plurality of states.

At step S1107, it may be determined whether the verification data is abnormal. If the verification data is abnormal as a result of the determination, the process proceeds to step S1109. If not, the process ends.

The abnormality of the verification data may be determined based on a result of comparison between the verification data and the reference data. The reference data may include reference cell count values that respectively correspond to the plurality of states according to a program pulse count.

At step S1109, the program operation may be determined to have failed.

Figure 12:
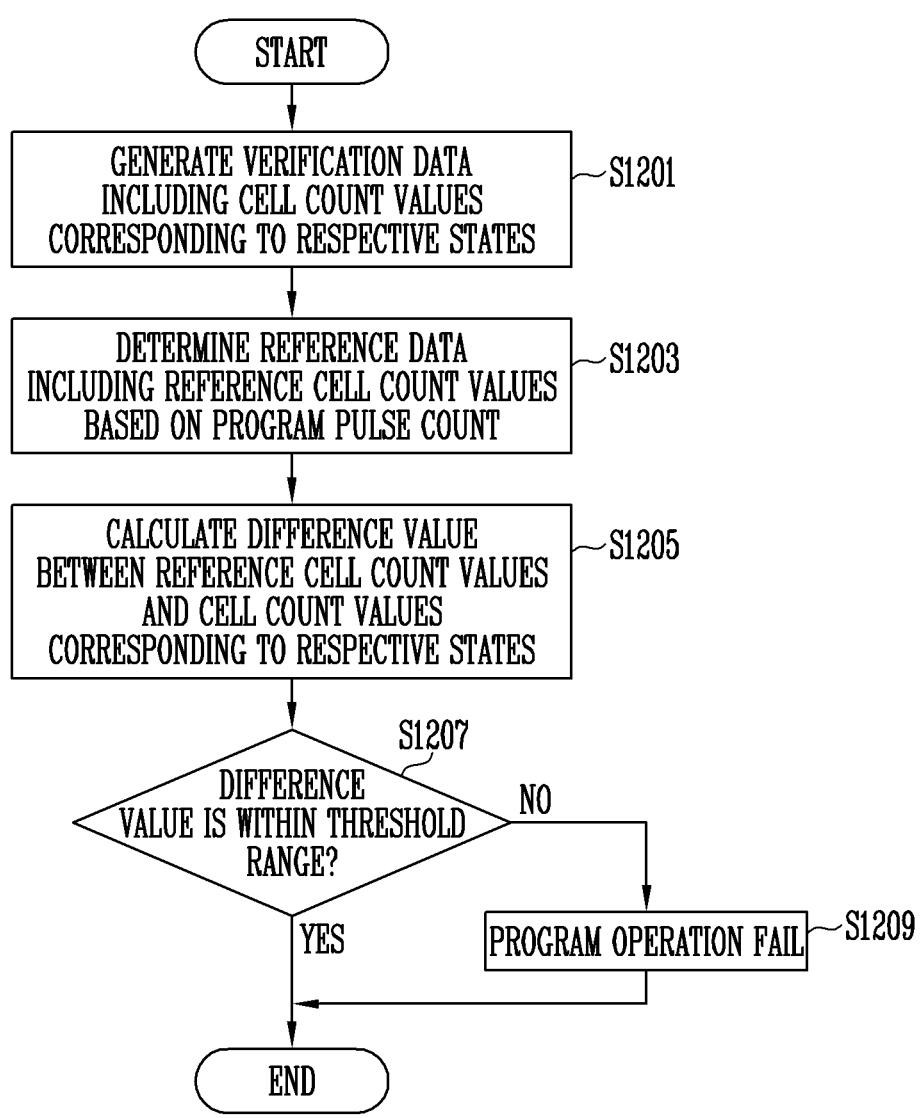
FIG. 12 is a flowchart for describing a verification data abnormality determination operation of FIG. 11.

FIG. 12 is a flowchart for describing a verification data abnormality determination operation of FIG. 11.

Referring to FIG. 12, at step S1201, verification data including cell count values that respectively correspond to the respective states may be generated.

At step S1203, reference data including reference cell count values that respectively correspond to the plurality of states may be determined based on the program pulse count.

At step S1205, difference values between the reference cell count values and the cell count values that correspond to the respective states may be calculated.

At step S1207, it may be determined whether each difference value is within a threshold range. The threshold range may be set to a predetermined percentage of the corresponding reference cell count value or a fixed value.

If each difference value is within the threshold range as a result of the determination, the process ends. If the difference value is outside the threshold range, the process proceeds to step S1209.

At step S1209, the program operation may be determined to have failed.

Although exemplary embodiments of the disclosure have been described for illustrative purposes, those skilled in the art will appreciate that various modifications, additions and substitutions are possible, without departing from the scope and spirit of the disclosure. Therefore, the embodiments disclosed above and in the accompanying drawings should be considered in a descriptive sense only and not for limiting the technological scope. The technological scope of the disclosure is not limited by the embodiments and the accompanying drawings. The spirit and scope of the disclosure should be interpreted by the appended claims and encompass all equivalents falling within the scope of the appended claims.

What is claimed is:

1. A memory device comprising:
   a memory cell array including a plurality of memory cells;
   a program and verify circuit configured to perform a program operation of programming each of the plurality of memory cells to a corresponding target state of a plurality of states, and generate verification data including cell count values that respectively correspond to one or more states among the plurality of states;
   a verify table storage configured to store, for each program pulse count, reference data including reference cell count values that respectively correspond to the plurality of states; and
   a program fail detector configured to detect whether the program operation has failed based on a result of comparison between the verification data and the reference data corresponding to a current program pulse count, and generate program fail information indicating whether or not the program operation has failed.

2. The memory device according to claim 1, further comprising a program pulse counter configured to calculate the current program pulse count which is a number of times a program pulse has been applied to the plurality of memory cells.

3. The memory device according to claim 1,
wherein the program operation comprises a program pulse application operation of applying a program voltage to a word line coupled with the plurality of memory cells, and a program verify operation, and
wherein the program verify operation comprises an operation of reading the plurality of memory cells using verify voltages corresponding to the one or more states among a plurality of verify voltages that respectively correspond to the plurality of states.

4. The memory device according to claim 3, wherein the program and verify circuit generates the verification data by counting a number of memory cells for each of threshold voltage sections divided by the verify voltages corresponding to the one or more states, based on data read from the plurality of memory cells during the program verify operation.

5. The memory device according to claim 1, wherein the program fail detector determines whether the program operation has failed, depending on whether the cell count values that respectively correspond to the one or more states are normal.

6. The memory device according to claim 5, wherein the program fail detector determines that the program operation has failed if at least one cell count value of the cell count values is abnormal.

7. The memory device according to claim 5, wherein the program fail detector calculates difference values between the cell count values and the reference cell count values that respectively correspond to the one or more states, and determines whether the cell count values are normal depending on whether the difference values are within a threshold range.

8. The memory device according to claim 1, wherein the program operation is performed in an incremental step pulse program (ISPP) scheme.

9. The memory device according to claim 1, wherein the reference cell count values vary depending on a width of a threshold voltage distribution of the plurality of memory cells that are in an erased state before the program operation.

10. A method of operating a memory device including a plurality of memory cells, the method comprising:
performing a program operation of programming each of the plurality of memory cells to a corresponding target state of a plurality of states;
generating verification data including cell count values that respectively correspond to one or more states among the plurality of states; and
detecting whether the program operation has failed based on a result of comparison between the verification data and reference data,
wherein the reference data includes reference cell count values that respectively correspond to the plurality of states and are determined based on a program pulse count which is a number of times a program pulse has been applied to the plurality of memory cells.

11. The method according to claim 10, wherein the performing of the program operation comprises:
performing a program pulse application operation of applying a program voltage to a word line coupled with the plurality of memory cells; and
performing a program verify operation of reading the plurality of memory cells using verify voltages corresponding to the one or more states among a plurality of verify voltages that respectively correspond to the plurality of states.

12. The method according to claim 11, wherein the generating of the verification data comprises generating the verification data by counting a number of memory cells of each of threshold voltage sections divided by the verify voltages corresponding to the one or more states, based on data read from the plurality of memory cells.

13. The method according to claim 10, wherein the detecting comprises:
determining whether the cell count values are normal, based on a result of comparison between the cell count values and the reference cell count values that respectively correspond to the one or more states; and
determining whether the program operation has failed depending on whether the cell count values are normal.

14. The method according to claim 13, wherein the determining of whether the cell count values are normal comprises determining whether the cell count values are normal depending on whether difference values between the cell count values and the reference count values are within a threshold range.

15. The method according to claim 13, wherein the determining of whether the program operation has failed comprises determining that the program operation has failed if at least one cell count value of the cell count values is abnormal.

16. The method according to claim 10, wherein the program operation is performed in an incremental step pulse program (ISPP) scheme.

17. A storage device comprising:
a memory device including a plurality of memory blocks; and
a memory controller configured to control the memory device to perform a program operation of programming each of a plurality of memory cells included in a selected block among the plurality of memory blocks to a corresponding target state of a plurality of states,
wherein the memory device detects whether the program operation has failed, based on a result of comparison between reference cell count values and cell count values that respectively correspond to one or more states among the plurality of states, and generates program fail information indicating whether or not the program operation has failed, and
wherein the reference cell count values are determined based on a program pulse count which is a number of times a program pulse has been applied to the plurality of memory cells.

18. The storage device according to claim 17, wherein the memory device calculates difference values between the cell count values and the reference cell count values, and detects whether the program operation has failed depending on whether the difference values are within a threshold range.

19. The storage device according to claim 17, wherein the memory controller provides a state read command to the memory device, receives a state read response for the state read command from the memory device, and determines whether the program operation has failed based on the program fail information included in the state read response.

20. The storage device according to claim 17, wherein the memory controller controls the memory device to copy, when the program operation fails, data stored in the selected block to a block other than the selected block among the plurality of memory blocks, and sets the selected block to a bad block.

21. An operating method of a memory device including a plurality of memory cells, the operating method comprising:
  performing a program operation of programming the memory cells to corresponding target states among predetermined states;
  counting a number of the memory cells that have each of the predetermined states due to the program operation; and
  determining the program operation to fail when the number is out of a predetermined range,
  wherein the predetermined range depends on a number of program pulses applied to the memory cells during the program operation.

* * * * *